United States Patent
Reed et al.

(10) Patent No.: US 10,334,187 B2
(45) Date of Patent: Jun. 25, 2019

(54) ADJUSTABLE STACKED FILTER ARRAYS FOR VEHICLE CAMERAS

(71) Applicant: Ford Global Technologies, LLC, Dearborn, MI (US)

(72) Inventors: Eric L. Reed, Livonia, MI (US); Jonathan Diedrich, Carleton, MI (US); Adil Nizam Siddiqui, Farmington Hills, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 111 days.

(21) Appl. No.: 15/670,814

(22) Filed: Aug. 7, 2017

(65) Prior Publication Data

US 2019/0045144 A1  Feb. 7, 2019

(51) Int. Cl.

| | |
|---|---|
| G06K 9/00 | (2006.01) |
| H04N 7/18 | (2006.01) |
| H04N 5/33 | (2006.01) |
| H04N 5/225 | (2006.01) |
| H04N 5/238 | (2006.01) |
| H04N 9/04 | (2006.01) |
| H04N 5/232 | (2006.01) |
| G02B 5/28 | (2006.01) |

(Continued)

(52) U.S. Cl.
CPC ............ *H04N 5/332* (2013.01); *G01J 5/0806* (2013.01); *G02B 5/281* (2013.01); *H01L 27/14621* (2013.01); *H04N 5/2254* (2013.01); *H04N 5/238* (2013.01); *H04N 5/23212* (2013.01); *H04N 9/045* (2013.01)

(58) Field of Classification Search
USPC ....... 382/100, 103, 106–107, 162, 168, 173, 382/181, 189, 199, 221, 224, 232, 254, 382/274, 276, 286–291, 305, 317; 701/36; 348/46, 148; 600/442
See application file for complete search history.

(56) References Cited

U.S. PATENT DOCUMENTS

| | | | |
|---|---|---|---|
| 7,538,311 | B2 | 5/2009 | Watanabe |
| 8,411,146 | B2 | 4/2013 | Twede |
| 2005/0157939 | A1 | 7/2005 | Arsenault |

(Continued)

FOREIGN PATENT DOCUMENTS

| | | |
|---|---|---|
| CN | 206100228 U | 4/1917 |
| CN | 108551549 A | 9/1918 |

(Continued)

OTHER PUBLICATIONS

Search Report dated Nov. 30, 2018 for GB Patent Application No. GB 1809060.5 (5 pages).

*Primary Examiner* — Seyed H Azarian
(74) *Attorney, Agent, or Firm* — Frank Lollo; Neal, Gerber & Eisenberg LLP; James P. Muraff

(57) ABSTRACT

Method and apparatus are disclosed for adjustable stacked filter arrays for vehicle cameras. An example vehicle includes a camera including a lens, and image sensors. The camera also includes LCD pass filter pixels and optical filter pixels stacked between the lens and the image sensors. The example vehicle also includes a filter controller to identify a first set of the optical filter pixels that form a filter setting and de-energize a first set of the LCD pass filter pixels to expose the first set of the optical filter pixels to form the filter setting.

13 Claims, 7 Drawing Sheets

(51) Int. Cl.
    *G01J 5/08*     (2006.01)
    *H01L 27/146*     (2006.01)

(56) References Cited

U.S. PATENT DOCUMENTS

| | | |
|---|---|---|
| 2012/0008930 A1 | 1/2012 | Barley et al. |
| 2012/0116632 A1* | 5/2012 | Bechtel ............... B60Q 1/1423 |
| | | 701/36 |
| 2014/0066767 A1* | 3/2014 | Mammone .......... G01S 7/52033 |
| | | 600/442 |
| 2015/0156427 A1 | 6/2015 | Wagner et al. |
| 2015/0256767 A1* | 9/2015 | Schlechter ............. G02B 5/208 |
| | | 348/46 |
| 2015/0321621 A1* | 11/2015 | Van Dan Elzen ....... H05K 1/09 |
| | | 348/148 |
| 2016/0200264 A1* | 7/2016 | Bingle .................... B60R 11/04 |
| | | 348/148 |
| 2017/0094258 A1 | 3/2017 | Cooper |
| 2017/0098313 A1 | 4/2017 | Collopy |

FOREIGN PATENT DOCUMENTS

| | | |
|---|---|---|
| CN | 201392444 Y | 1/2010 |
| CN | 205958900 U | 2/2017 |
| DE | 102014215373 A1 | 2/2016 |
| KR | 20100104556 A | 9/2010 |
| KR | 101639685 B1 | 7/2016 |

\* cited by examiner

US 10,334,187 B2

ADJUSTABLE STACKED FILTER ARRAYS FOR VEHICLE CAMERAS

TECHNICAL FIELD

The present disclosure generally relates to cameras and, more specifically, to adjustable stacked filter arrays for vehicle cameras.

BACKGROUND

Oftentimes, a vehicle include one or more cameras (e.g., digital cameras, analog cameras) that capture image(s) and/or video of an area within a cabin of the vehicle and/or a surrounding area of the vehicle. The camera(s) may be positioned within the cabin and/or along an exterior surface of the vehicle. In some instances, image(s) and/or video captured via a vehicle camera are presented to a driver (e.g., via a center console display) to facilitate the driver in operating the vehicle. Further, in some instances, image(s) and/or video captured via a vehicle camera are analyzed to enable autonomous and/or semi-autonomous motive functions performed by the vehicle.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown for adjustable stacked filter arrays for cameras. An example disclosed vehicle includes a camera including a lens, and image sensors. The camera also includes LCD pass filter pixels and optical filter pixels stacked between the lens and the image sensors. The example disclosed vehicle also includes a filter controller to identify a first set of the optical filter pixels that form a filter setting and de-energize a first set of the LCD pass filter pixels to expose the first set of the optical filter pixels to form the filter setting.

An example disclosed method includes determining a filter setting of a vehicle camera, identifying a first set of optical filter pixels positioned between a lens and image sensors of the vehicle camera that form the filter setting, and de-energizing a first set of LCD pass filter pixels stacked with the optical filter pixels between the lens and the image sensors to expose the first set of the optical filter pixels to form the filter setting.

An example disclosed camera includes a lens and image sensors. The example disclosed camera also includes a first plate including LCD pass filter pixels and positioned between the lens and the image sensors. The example disclosed camera also includes a second plate including optical filter arrays and stacked with the first plate between the lens and the image sensors. A first set of the LCD pass filter pixels is to be de-energized to expose a first set of the optical filter pixels to form a filter setting.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
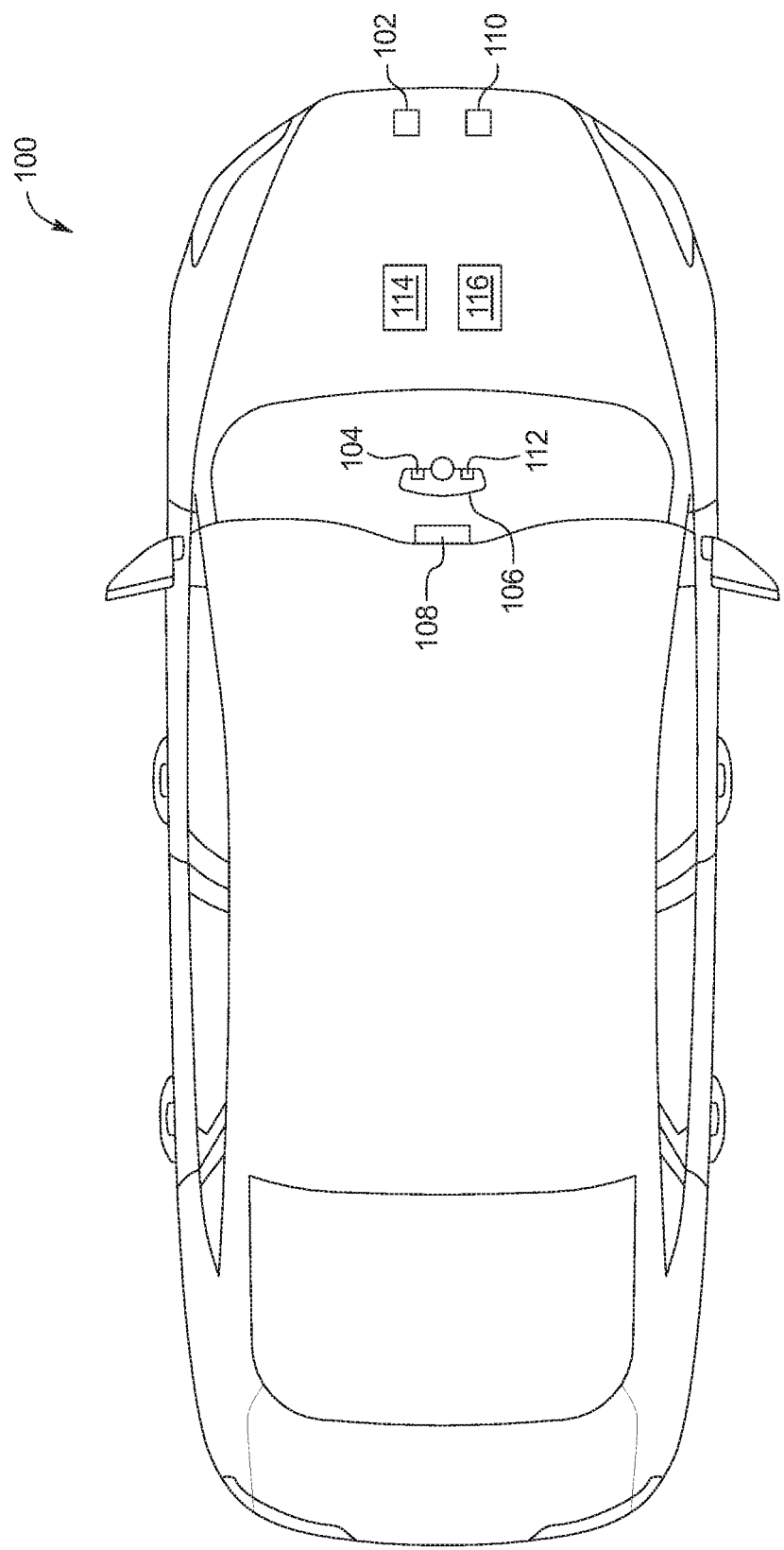
FIG. 1 illustrates an example vehicle in accordance with the teachings herein.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Oftentimes, a vehicle include one or more cameras (e.g., digital cameras, analog cameras) that capture image(s) and/or video of an area within a cabin of the vehicle and/or a surrounding area of the vehicle. The camera(s) may be positioned within the cabin and/or along an exterior surface of the vehicle. In some instances, image(s) and/or video captured via a vehicle camera are presented to a driver (e.g., via a center console display) to facilitate the driver in operating the vehicle. Further, in some instances, image(s) and/or video captured via a vehicle camera are analyzed to enable autonomous and/or semi-autonomous motive functions performed by the vehicle. Some vehicle cameras include a filter to facilitate obtainment of clear images. Typically, the filter facilitates the vehicle camera in obtaining clear images in one lighting environment (e.g., clear skies) but does not facilitate the vehicle camera in obtaining clear images in other lighting environments (e.g., foggy conditions).

Examples methods and apparatus disclosed herein include a camera that is configured to utilize a plurality of different filters and to adjust which of the plurality of different filters is utilized at a particular moment. Examples disclosed herein include a filter mechanism of a vehicle camera. The filter mechanism includes filter layers positioned in an overlapping manner between a lens and image sensors of the vehicle camera. A first filter layer is an LCD pass array control that includes a pattern of LCD pass array pixels that are configured to function as light-blocking pixels when energized and light-conducting pixels when de-energized. The LCD pass array pixels may be in a standard pixel array or a photon sieve pattern that reduces a need for focusing the lens. A second filter layer includes an array optical filters that includes, for example, clear filters, NIR pass filters, NIR cut filters, and linear polarizers. To activate a filter setting of the vehicle camera, one or more of the LCD pass array pixels may be energized, via an electrical signal, to block light to a first set of the optical filters and to permit light to a second set of the optical filters that forms the filter setting.

Turning to the figures, FIG. 1 illustrates an example vehicle 100 in accordance with the teachings herein. The vehicle 100 may be a standard gasoline powered vehicle, a hybrid vehicle, an electric vehicle, a fuel cell vehicle, and/or any other mobility implement type of vehicle. The vehicle 100 includes parts related to mobility, such as a powertrain with an engine, a transmission, a suspension, a driveshaft, and/or wheels, etc. The vehicle 100 may be non-autonomous, semi-autonomous (e.g., some routine motive functions controlled by the vehicle 100), or autonomous (e.g., motive functions are controlled by the vehicle 100 without direct driver input). In the illustrated example, the vehicle 100 includes a camera 102 (e.g., a first camera) positioned along an exterior of the vehicle 100 and another camera 104 (e.g., a second camera) positioned within a cabin of the vehicle 100.

The camera 102 of the illustrated example is a front-view camera (e.g., a first front-view camera) that captures image(s) and/or video of an area in front of the vehicle 100. Additionally or alternatively, the vehicle 100 includes another camera positioned at another location along the exterior of the vehicle 100. For example, the camera 102 and/or another camera may be positioned to be a side-view camera, a rear-view camera, etc.

Further, the camera 104 of the illustrated example is located on a rearview mirror 106 within a cabin of the vehicle 100. For example, the camera 104 is a front-view camera (e.g., a second front-view camera) that is directed and/or oriented in a direction toward the front of the vehicle 100 to enable the camera 104 to capture image(s) and/or video of the area in front of the vehicle 100 (e.g., through a front windshield). In other examples, the camera 104 is directed and/or oriented in another direction to capture image(s) and/or video in that direction. For example, the camera 104 may directed and/or oriented to capture image(s) and/or video within the cabin of the vehicle and/or in another direction outside of the vehicle 100. Additionally or alternatively, the vehicle 100 may include another camera located at any other position within the cabin of the vehicle 100 to capture image(s) and/or video within and/or outside of the cabin of the vehicle 100.

In some examples, the image(s) and/or video captured by the camera 102 and/or the camera 104 are presented to a driver and/or other occupant(s) (e.g., passengers) of the vehicle 100 via a display 108, such as a center console display, to facilitate the driver in maneuvering the vehicle 100. Further, in some examples, the captured image(s) and/or video are utilized to facilitate the vehicle 100 in performing autonomous and/or semi-autonomous driving maneuver(s).

The camera 102 and/or the camera 104 of the illustrated example are configured to measure a luminosity, a brightness, and/or other characteristics of ambient light. For example, the camera 102 includes sensors that detect characteristics of ambient light (e.g., a luminosity, a brightness, and/or other characteristics) around the camera 102, and the camera 104 includes sensors that detect characteristics of ambient light around the camera 104. Further, the vehicle 100 of the illustrated example includes sensors that are configured to detect characteristics of ambient light around the cameras of the vehicle 100. For example, an ambient light sensor 110 (e.g., a first ambient light sensor) detects characteristics of the ambient light around the camera 102, and an ambient light sensor 112 (e.g., a second ambient light sensor) detects characteristics of the ambient light around the camera 104. That is, the camera 102 and/or the ambient light sensor 110 may be utilized to determine ambient light characteristics of the camera 102, and the camera 104 and/or the ambient light sensor 112 may be utilized to determine ambient light characteristics of the camera 104.

The vehicle 100 of the illustrated example also includes a camera module 114 and a filter controller 116. The camera module 114 controls operation of the camera 102, the camera 104, and/or any other camera of the vehicle 100 to collect image(s) and/or video that are presented to occupant(s) of the vehicle 100 and/or utilized to facilitate the vehicle 100 in performing autonomous and/or semi-autonomous driving maneuver(s). The filter controller 116 identifies ambient light condition(s) of the camera 102 and/or the camera 104, determines filter setting(s) for the camera 102 and/or the camera 104 based on the identified ambient light condition(s), and controls operation of the camera 102 and/or the camera 104 to form the respective filter setting(s).

Figure 2:
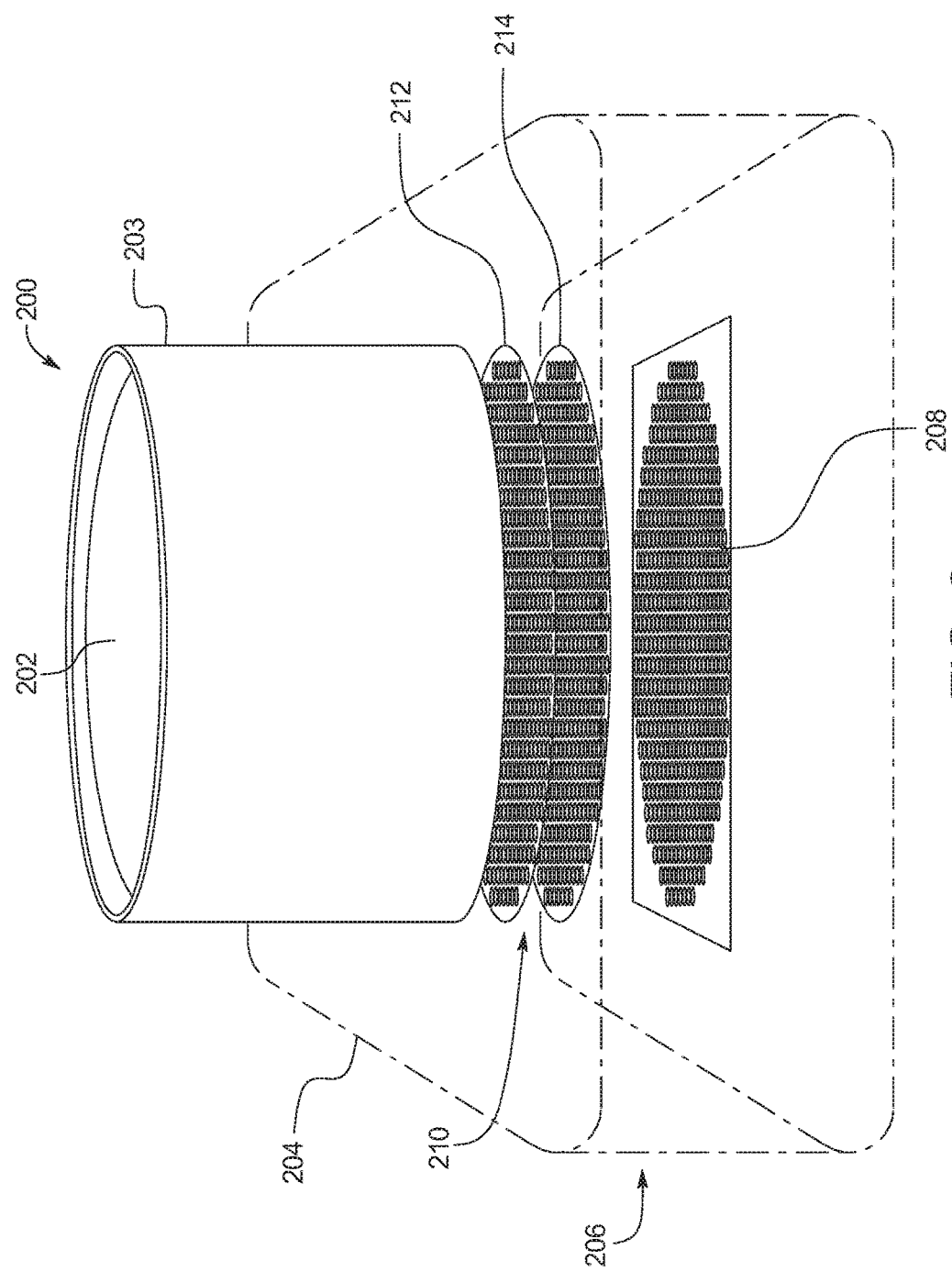
FIG. 2 illustrates an example camera of the vehicle of FIG. 1 in accordance with the teachings herein.

FIG. 2 illustrates an example camera 200 in accordance with the teachings herein. For example, the camera 200 represents the camera 102, the camera 104, and/or any other camera of the vehicle 100. In the illustrated example, the camera 200 includes a lens 202 that is housed within a lens housing 203 of the camera 200. As illustrated in FIG. 2, the lens housing 203 is coupled to a front of the camera body 204 of the camera 200. The camera body 204 defines a cavity 206 in which image sensors 208 and a filter assembly 210 are positioned. The image sensors 208 are located toward a back of the camera body 204 within the cavity 206, and the filter assembly 210 is positioned between the lens 202 and the image sensors 208 within the cavity 206 (e.g., between the front and the back of the camera body 204). That is, the camera body 204 of the illustrated example houses the image sensors 208 and the filter assembly 210.

The lens 202 of the camera 200 of the illustrated example directs light to the image sensors 208 by refracting light onto the image sensors 208 (e.g., onto an image plane defined by the image sensors 208). For example, the lens 202 is formed of a glass material to refract the light. The lens 202 includes a focal length that determines a magnification of an image projected onto the image plane of the image sensors 208 and includes a maximum aperture that affects an intensity of light captured via the camera 200. The image sensors 208 of the camera 200 collect light that is directed by the lens 202 to the image plane formed by the image sensors 208, converts attenuation of light waves of the collected light into signals, and creates an image based upon those signals. For example, the image sensors 208 are digital imaging sensors such as charge-couple device (CCD) sensors, complementary metal-oxide-semiconductor (CMOS) sensors, N-type metal-oxide-semiconductor (NMOS) sensors, etc.

The filter assembly 210 of the illustrated example includes a plate 212 (e.g., a first plate) and a plate 214 (e.g., a second plate). In the illustrated example, the plate 212 and the plate 214 are spaced apart from each other within the cavity 206 of the camera body 204. The plate 212 includes an array of liquid crystal display (LCD) pass filter pixels (e.g., LCD pass filter pixels 302 of FIGS. 3A-3B) and the plate includes an array of optical filter pixels (e.g., optical filter pixels 402 of FIG. 4) such that the LCD pass filter pixels and the optical filter pixels are stacked relative to each other between the lens 202 and the image sensors 208 of the camera 200. In the illustrated example, the plate 212 is positioned between the lens 202 and the plate 214 such that the LCD pass filter pixels are stacked between the lens 202 and the optical filter pixels. In other examples, the plate 212 may be positioned between the image sensors 208 and the plate 214 such that the LCD pass filter pixels are positioned between the image sensors 208 and the optical filter pixels.

In the illustrated example, each of the optical filter pixels of the plate 214 is an optical filter (e.g., formed of glass, plastic, and/or other transparent materials) that selectively transmit light of different wavelengths to the image sensors 208 to affect the image(s) and/or video captured by the camera 200. For example, the optical filter pixels of the plate 214 include a plurality of different types of optical filters (e.g., near-infrared pass filters, near-infrared cut filters, polarizing filters, clear filters, etc.) that each filter light differently relative to the other types of optical filters.

Further, each of the LCD pass filter pixels of the plate 212 is an LCD pass filter that is configured to be energized and/or de-energized via an electrical signal. For example, each of the LCD pass filter pixels of the plate 212 is energized when receiving an electrical signal and de-energized when not receiving an electrical signal. When an LCD pass filter pixel is energized, the LCD pass filter becomes opaque to block and/or prevent light from passing through the LCD pass filter pixel. Conversely, when an LCD pass filter pixel is de-energized, the LCD pass filter becomes transparent to enable light to pass through the LCD pass filter pixel (e.g., to one or more of the optical filter pixels and/or the image sensors 208).

In operation, the filter controller 116 determines a light condition based upon characteristics of light (e.g., ambient light) surrounding the camera 200. For example, the filter controller 116 may determine the light condition based upon light collected by the camera 200 (e.g., the camera 102, the camera 104) and/or a nearby ambient light sensor (e.g., the ambient light sensor 110, the ambient light sensor 112). Based upon the light condition, the filter controller 116 determines a filter setting (e.g., a first filter setting) of the filter assembly 210 to facilitate the camera 200 in capturing image(s) and/or video of the surrounding area.

Further, the filter controller 116 identifies a first set of optical filter pixels of the plate 214 that form the filter setting for the camera 200. Subsequently, the filter controller 116 de-energizes a first set of the LCD pass filter pixels of the plate 212 that correspond to the first set of the optical filter pixels of the plate 214 to expose the first set of the optical filter pixels and, thus, enable light to travel through the first set of the optical filter pixels. Further, the filter controller 116 energizes a second set of the LCD pass filter pixels of the plate 212 that correspond to a second set of the optical filter pixels of the plate 214 that do not form the filter setting to cover the second set of the optical filter pixels and, thus, prevent light from travelling through the second set of the optical filter pixels. That is, the filter controller 116 identifies the first set of LCD pass filter pixels to de-energize, identifies the second set of LCD pass filter pixels to energize, and sends an electrical signal to the second set of LCD pass filter pixels to form the filter setting.

Additionally or alternatively, the filter controller 116 determines another filter setting (e.g., a second filter setting) of the filter assembly 210 based upon different light conditions surrounding the camera 200. To form the other filter setting, the filter controller 116 identifies a third set of optical filter pixels of the plate 214 that form the other filter setting, identify and de-energize a third set of the LCD pass filter pixels of the plate 212 that correspond to the third set of the optical filter pixels of the plate 214, and identify and energize (e.g., by sending an electrical signal) a fourth set of the LCD pass filter pixels of the plate 212 that correspond to a fourth set of the optical filter pixels of the plate 214.

Figure 3A:
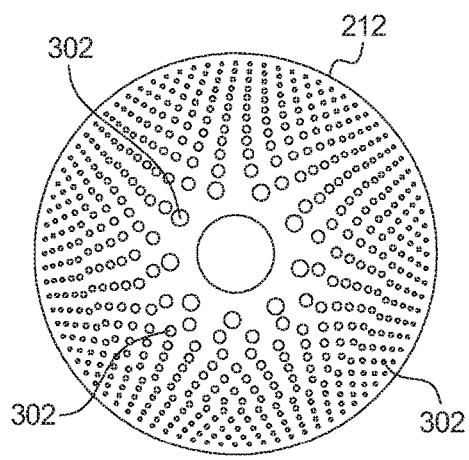
FIG. 3A illustrates an LCD filter array of the camera of FIG. 2 that includes LCD pixels in a first pattern.
Figure 3B:
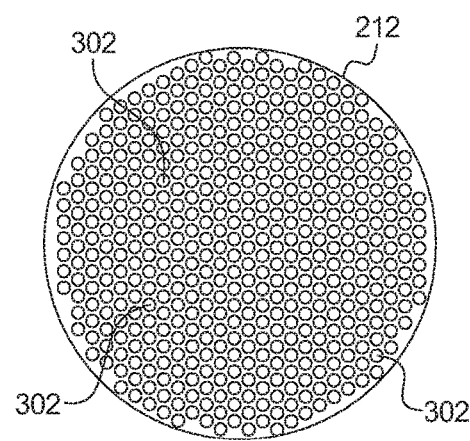
FIG. 3B illustrates an LCD filter array of the camera of FIG. 2 that includes LCD pixels in a second pattern.

FIGS. 3A and 3B illustrate the plate 212 including an array of LCD pass filter pixels 302 in different respective patterns. More specifically, FIG. 3A depicts the LCD pass filter pixels 302 in a first pattern, and FIG. 3B depicts the LCD pass filter pixels 302 in a second pattern.

In the illustrated examples, Each of the LCD pass filter pixels 302 is an electrically-modulated optical pixel that utilizes light-modulating characteristics of liquid crystals to transition between an opaque setting and a transparent setting. That is, each the LCD pass filter pixels 302 modulate between being opaque and being transparent based upon an electrical signal. For example, each of the LCD pass filter pixels 302 is transparent when de-energized (e.g., to expose an adjacent one or more of the optical filter pixels 402 of FIG. 4) and opaque when energized (e.g., to cover the adjacent one or more of the optical filter pixels 402). Further, each of the LCD pass filter pixels 302 is de-energized when that one of the LCD pass filter pixels 302 is not receiving an electrical signal and is energized when that one of the LCD pass filter pixels 302 is receiving an electrical signal (e.g., from the filter controller 116). While the plate 212 of the illustrated example includes the LCD pass filter pixels 302, the plate 212 may include any other type of pixels that is capable of modulating between an opaque setting and a transparent setting in a controlled manner.

In FIG. 3A, the LCD pass filter pixels 302 form a photon sieve pattern on the plate 212 in which those of the LCD pass filter pixels 302 closer to a center of the photon sieve pattern and/or the plate 212 are larger than those of the LCD pass filter pixels 302 that are farther from the center and/or closer to an outer edge of the photon sieve pattern and/or the plate 212. The photon sieve pattern of the LCD pass filter pixels 302 that utilizes diffraction and interference of light travelling through the LCD pass filter pixels 302 to affect light captured by the camera 200. In some examples, the photon sieve pattern of the LCD pass filter pixels 302 increases a focus of light captured by the camera 200.

In FIG. 3B, the LCD pass filter pixels 302 form a one-for-one pattern with respect to corresponding optical filter pixels (e.g., optical filter pixels 402 of FIG. 4) of the plate 214. That is, each of the LCD pass filter pixels 302 of the plate 212 is configured to align with a respective one of the optical filter pixels of the plate 214 to control whether light travels through the respective one of the optical filter pixels. For example, if one of the LCD pass filter pixels 302 is opaque, light is unable to travel through the respective one of the optical filter pixels to the image sensors 208. Conversely, if one of the LCD pass filter pixels 302 is transparent, light is able to through the respective one of the optical filter pixels to the image sensors 208.

Figure 4:
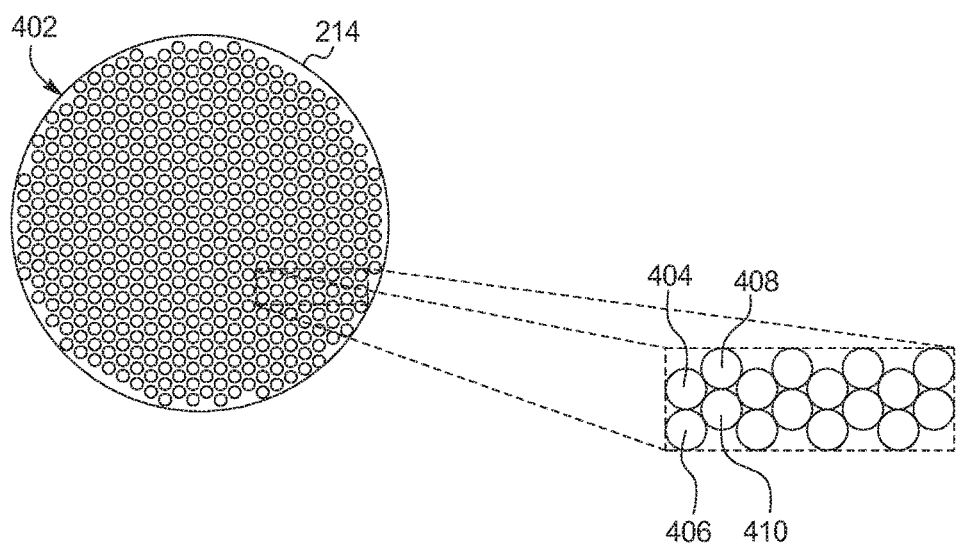
FIG. 4 illustrates an optical filter array of the camera of FIG. 2.

FIG. 4 illustrates an example of the plate 214 of the filter assembly 210 of the camera 200. The optical filter pixels 402 of the illustrated example include a plurality of filter types. For example, the optical filter pixels 402 of FIG. 4 include one or more near-infrared (NIR) pass filter pixels 404, one or more near-infrared (NIR) cut filter pixels 406, one or more polarizing filter pixels 408, and one or more clear filter pixels 410.

NIR pass filters enable light near the visible light spectrum (e.g., light having wavelengths of about between 700 nanometers and 1100 nanometers). The NIR pass filter pixels 404 enable the near-infrared light pass through to the image sensors 208 to cause image(s) captured by the camera 200 to include light similar to that detected by human vision.

NIR cut filters that enable visible light (e.g., light having wavelengths of about between 400 nanometers and 700 nanometers) to pass through and reflect infrared light that is near the visible light spectrum (e.g., light having wavelengths of about between 700 nanometers and 2500 nanometers). The NIR cut filter pixels 406 filter out the near-infrared light from the light collected by the image sensors 208 to cause image(s) captured by the camera 200 to include light similar to what humans see via an unaided eye.

Polarizing filters (e.g., linear polarizer filters, circular polarizer filters) enable light wavelengths in some orientations to pass though and prevent other light wavelengths in other orientations from passing through. For example, a linear polarizer filter filters plane-polarized wavelengths that are oriented in predetermined orientations. The polarizing filter pixels 408 (e.g., linear polarizing filters) prevent light wavelengths in some orientations and enable light wavelengths in other orientations to pass through to the image sensors 208 of the camera 200 to reduce glare caused by reflective surface(s) in image(s) captured by the camera 200.

Further, clear filters (e.g., formed of glass, plastic, and/or other transparent material) do not affect or filter light. That is, the clear filter pixels 410 do not affect or filter light that travels between the lens 202 and the image sensors 208.

In the illustrated example, the filter types of the optical filter pixels 402 are intermixed along the plate 214. For example, the NIR pass filter pixels 404, the NIR cut filter pixels 406, the polarizing filter pixels 408, and the clear filter pixels 410 according to the 4-color map theorem such that none of the NIR pass filter pixels 404 border each other, none of the NIR cut filter pixels 406 border each other, none of the polarizing filter pixels 408 border each other, and none of the clear filter pixels 410 border each other. In other examples, the NIR pass filter pixels 404, the NIR cut filter pixels 406, the polarizing filter pixels 408, and the clear filter pixels 410 may be arranged in any other pattern on the plate 214. Further, in other examples, the optical filter pixels 402 includes any other combination of filter types that produce filter setting(s) to facilitate the camera 200 in capturing image(s) and/or video. For example, the optical filter pixels 402 may include more filter types, less filter types, and/or different filter types.

Figure 5A:
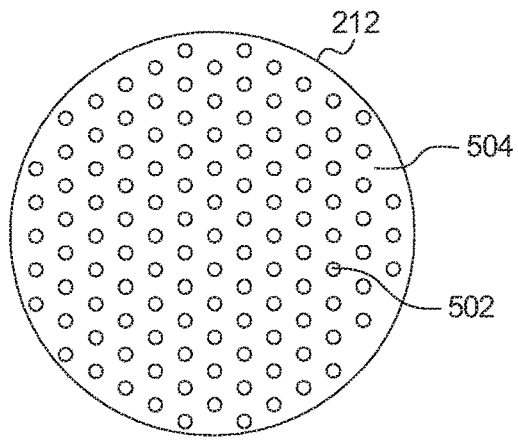
FIG. 5A illustrates an LCD filter array of the camera of FIG. 2 with energized and de-energized LCD pixels.
Figure 5B:
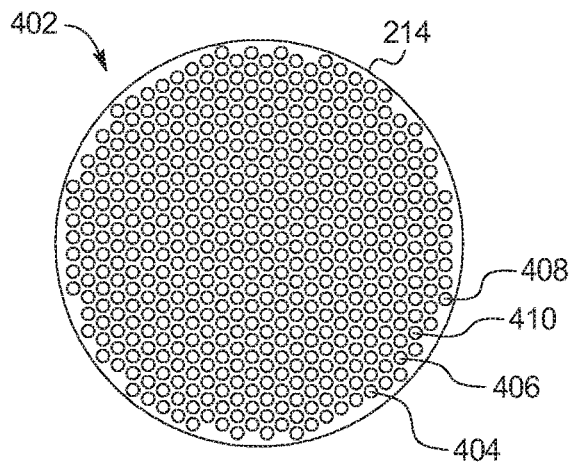
FIG. 5B illustrates an optical filter array of the camera of FIG. 2.
Figure 5C:
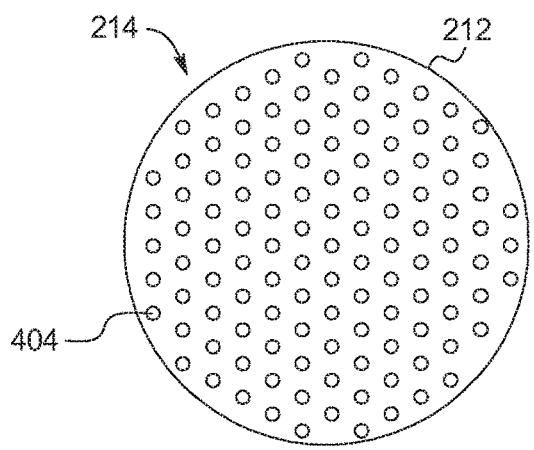
FIG. 5C illustrates the LCD filter array of FIG. 5A stacked with the optical filter array of FIG. 5B.

FIGS. 5A-5C depict the plate 212 and the plate 214 of the filter assembly 210 when stacked together. More specifically, FIG. 5A illustrates the LCD pass filter pixels 302 with energized and de-energized pixels, FIG. 5B illustrates the optical filter pixels 402, and FIG. 5C illustrates the LCD pass filter pixels 302 and the optical filter pixels 402 stacked together to form a filter setting of the camera 200.

As illustrated in FIG. 5A, the LCD pass filter pixels 302 of the plate 214 include de-energized pixels 502 and energized pixels 504. The de-energized pixels 502 are transparent to enable light to travel to a corresponding one or more of the optical filter pixels 402, and the energized pixels 504 are opaque to prevent light from travelling to the corresponding one or more of the optical filter pixels 402.

FIG. 5B further depicts the optical filter pixels 402 of the plate 214. As illustrated in FIG. 5B, the optical filter pixels 402 include one or more of the NIR pass filter pixels 404, one or more of the NIR cut filter pixels 406, one or more of the polarizing filter pixels 408, and one or more of the clear filter pixels 410.

FIG. 5C illustrates the plate 212 positioned over the plate 214 in a stacked manner to form the filter setting of the camera 200. In the illustrated example, the filter setting formed by the filter assembly 210 includes the NIR pass filter pixels 404 of the optical filter pixels 402. For example, the de-energized pixels 502 are transparent to enable light to travel to the NIR pass filter pixels 404 to enable the NIR pass filter pixels 404 to form the filter setting. Further, the energized pixels 504 are opaque to cover the NIR cut filter pixels 406, the polarizing filter pixels 408, and the clear filter pixels 410 to prevent the NIR cut filter pixels 406, the polarizing filter pixels 408, and the clear filter pixels 410 from forming the filter setting.

In the illustrated example of FIGS. 5A-5C, the filter controller 116 identified a first set of the LCD pass filter pixels 302 for the de-energized pixels 502 and a second set of the LCD pass filter pixels 302 for the energized pixels 504 upon determining that the NIR pass filter pixels 404 are to form the filter setting. For example, the filter controller 116 identified those of the LCD pass filter pixels 302 that correspond to the NIR pass filter pixels 404 as the de-energized pixels 502 to enable light to travel through the NIR pass filter pixels 404. Further, the filter controller 116 identified those of the LCD pass filter pixels 302 that do correspond to the NIR pass filter pixels 404 as the energized pixels 504 to prevent light from travelling through the NIR cut filter pixels 406, the polarizing filter pixels 408, and the clear filter pixels 410.

In other examples, the de-energized pixels 502 correspond to one or more of the NIR pass filter pixels 404, one or more of the NIR cut filter pixels 406, one or more of the polarizing filter pixels 408, one or more of the clear filter pixels 410, and/or any combination thereof that form a selected filter setting. In such examples, the energized pixels 504 correspond to one or more of the NIR pass filter pixels 404, one or more of the NIR cut filter pixels 406, one or more of the polarizing filter pixels 408, one or more of the clear filter pixels 410, and/or any combination thereof that do not form a selected filter setting.

Figure 6:
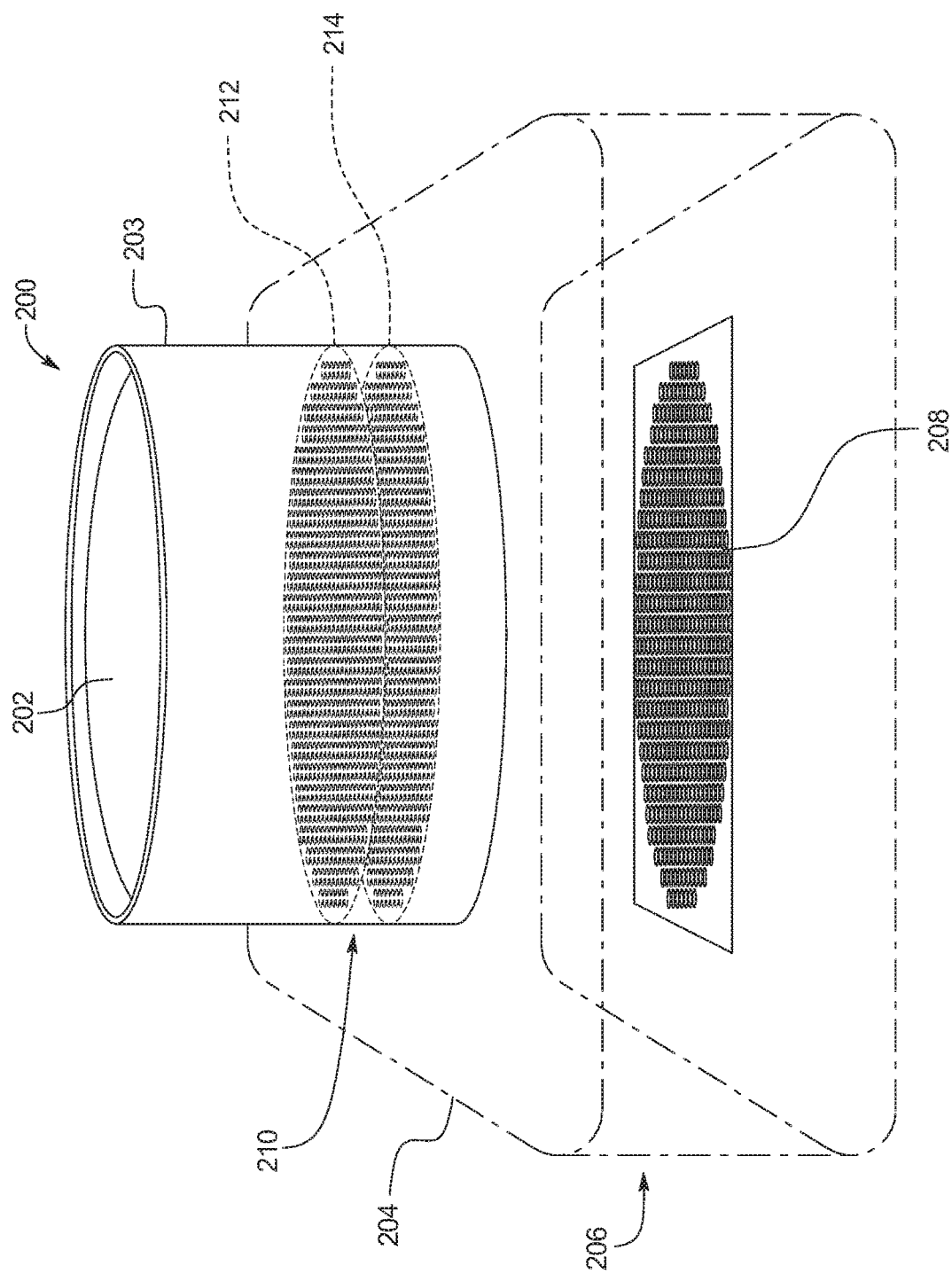
FIG. 6 illustrates another example camera of the vehicle of FIG. 1 in accordance with the teachings herein.

FIG. 6 illustrates another example camera 600 in accordance with the teachings herein. For example, the camera 600 represents the camera 102, the camera 104, and/or any other camera of the vehicle 100. The camera 600 illustrated in FIG. 6 includes the lens housing 203, the lens 202, the camera body 204, the filter assembly 210, the plate 212, the plate 214, the LCD pass filter pixels 302, and the optical filter pixels 402 that are identical and/or otherwise substantially similar to the lens housing 203, the lens 202, the camera body 204, the filter assembly 210, the plate 212, the plate 214, the LCD pass filter pixels 302, and the optical filter pixels 402 of the camera 200 of FIGS. 2-5C. Because those components are disclosed above in detail with respect to FIGS. 2-5C, some characteristics of those components will not be further disclosed below.

As illustrated in FIG. 6, the lens housing 203 of the camera 600 is coupled to the front of the camera body 204 and houses the lens 202, the plate 212, and the plate 214 of the camera 200. The camera body 204 defines the cavity 206 in which the image sensors 208 are positioned. Further, the plate 212 and the plate 214 of the filter assembly 210 are positioned between the lens 202 and the image sensors 208 within the lens housing 203. In the illustrated example, the plate 212 is positioned between the lens 202 and the plate 214 such that the LCD pass filter pixels 302 are stacked between the lens 202 and the optical filter pixels 402. In other examples, the plate 212 may be positioned between the image sensors 208 and the plate 214 such that the LCD pass filter pixels 302 are positioned between the image sensors 208 and the optical filter pixels 402.

In operation, the filter controller 116 determines a light condition based upon characteristics of light (e.g., ambient light) surrounding the camera 200. Based upon the light condition, the filter controller 116 determines a filter setting (e.g., a first filter setting, a second filter setting) of the filter assembly 210 to facilitate the camera 200 in capturing image(s) and/or video of the surrounding area. Further, the filter controller 116 identifies one set of optical filter pixels (e.g., a first set of optical filter pixels, a third set of optical filter pixels) that form the filter setting for the camera 200. Subsequently, the filter controller 116 de-energizes a corresponding set of the LCD pass filter pixels (e.g., a first set of LCD pass filter pixels, a third set of LCD pass filter pixels) to enable light to travel through that set of the optical filter pixels. Further, the filter controller 116 energizes another set of the LCD pass filter pixels (e.g., a second set of LCD pass filter pixels, a fourth set of LCD pass filter pixels) that correspond to another set of the optical filter pixels (e.g., a second set of optical filter pixels, a fourth set of optical filter pixels) that do not form the filter setting to prevent light from travelling through that set of the optical filter pixels.

Figure 7:
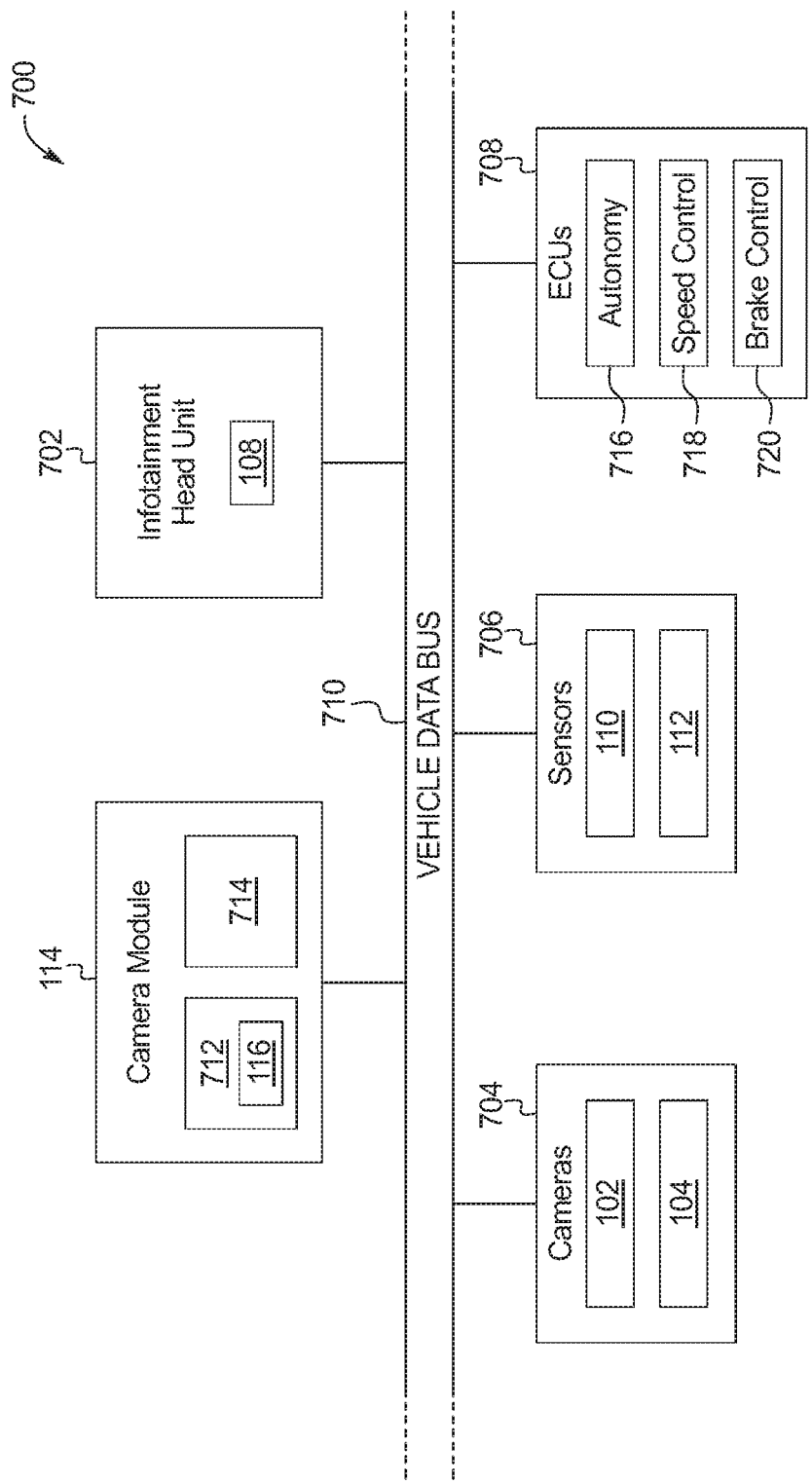
FIG. 7 is a block diagram of electronic components of the vehicle of FIG. 1.

FIG. 7 is a block diagram of electronic components 700 of the vehicle of FIG. 1. As illustrated in FIG. 7, the electronic components 700 include the camera module 114, an infotainment head unit 702, cameras 704, sensors 706, electronic control units (ECUs) 708, and a vehicle data bus 710.

The camera module 114 includes a microcontroller unit, controller or processor 712 and memory 714. In some examples, the processor 712 of the camera module 114 is structured to include the filter controller 116. Alternatively, in some examples, the filter controller 116 incorporated into another electronic control unit (ECU) with its own processor 712 and memory 714. The processor 712 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory 714 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory 714 includes multiple kinds of memory, particularly volatile memory and non-volatile memory.

The memory 714 is computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 714, the computer readable medium, and/or within the processor 712 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The infotainment head unit 702 provides an interface between the vehicle 100 and a user. The infotainment head unit 702 includes digital and/or analog interfaces (e.g., input devices and output devices) to receive input from and display information for the user(s). The input devices include, for example, a control knob, an instrument panel, a digital camera for image capture and/or visual command recognition, a touch screen, an audio input device (e.g., cabin microphone), buttons, or a touchpad. The output devices may include instrument cluster outputs (e.g., dials, lighting devices), actuators, the display 108 (e.g., a heads-up display, a center console display such as a liquid crystal display (LCD), an organic light emitting diode (OLED) display, a flat panel display, a solid state display, etc.), and/or speakers. In the illustrated example, the infotainment head unit 702 includes hardware (e.g., a processor or controller, memory, storage, etc.) and software (e.g., an operating system, etc.) for an infotainment system (such as SYNC® and MyFord Touch® by Ford®). Additionally, the infotainment head unit 702 displays the infotainment system on, for example, the display 108.

The cameras 704 are arranged in and around the vehicle 100 to capture image(s) and/or video of an area within a cabin of the vehicle 100 and/or a surrounding area of the vehicle 100. One or more of the cameras 704 may be mounted along an exterior of the vehicle 100 and/or within the cabin of the vehicle 100. The image(s) and/or video captured by the cameras 704 are presented to occupant(s) of the vehicle 100 (e.g., via the display 108) and/or utilized to facilitate performance of autonomous and/or semi-autonomous driving maneuvers of the vehicle 100. The cameras 704 of the illustrated example include the camera 102 (e.g., the camera 200, the camera 600) and the camera 104 (e.g., the camera 200, the camera 600).

The sensors 706 are arranged in and around the vehicle 100 to monitor properties of the vehicle 100 and/or an environment in which the vehicle 100 is located. One or more of the sensors 706 may be mounted to measure properties around an exterior of the vehicle 100. Additionally or alternatively, one or more of the sensors 706 may be mounted inside a cabin of the vehicle 100 or in a body of the vehicle 100 (e.g., an engine compartment, wheel wells, etc.) to measure properties in an interior of the vehicle 100. For example, the sensors 706 include accelerometers, odometers, tachometers, pitch and yaw sensors, wheel speed sensors, microphones, tire pressure sensors, biometric sensors and/or sensors of any other suitable type. In the illustrated example, the sensors 706 include the ambient light sensor 110 and the ambient light sensor 112.

The ECUs 708 monitor and control the subsystems of the vehicle 100. For example, the ECUs 708 are discrete sets of electronics that include their own circuit(s) (e.g., integrated circuits, microprocessors, memory, storage, etc.) and firmware, sensors, actuators, and/or mounting hardware. The ECUs 708 communicate and exchange information via a vehicle data bus (e.g., the vehicle data bus 710). Additionally, the ECUs 708 may communicate properties (e.g., status of the ECUs 708, sensor readings, control state, error and diagnostic codes, etc.) to and/or receive requests from each other. For example, the vehicle 100 may have seventy or more of the ECUs 708 that are positioned in various locations around the vehicle 100 and are communicatively coupled by the vehicle data bus 710.

In the illustrated example, the ECUs 708 include an autonomy unit 716, a speed control unit 718, and a brake control module 720. For example, the autonomy unit 716 controls performance of autonomous and/or semi-autonomous driving maneuvers of the vehicle 100 based upon, at least in part, image(s) and/or video captured by the cameras 704. The speed control unit 718 autonomously controls a speed at which the vehicle 100 travels based upon, at least in part, image(s) and/or video captured by the cameras 704. Further, the brake control module 720 autonomously operates brakes of the vehicle 100 based upon, at least in part, image(s) and/or video captured by the cameras 704.

The vehicle data bus 710 communicatively couples the camera module 114, the infotainment head unit 702, the cameras 704, the sensors 706, and the ECUs 708. In some examples, the vehicle data bus 710 includes one or more data buses. The vehicle data bus 710 may be implemented in accordance with a controller area network (CAN) bus protocol as defined by International Standards Organization (ISO) 11898-1, a Media Oriented Systems Transport (MOST) bus protocol, a CAN flexible data (CAN-FD) bus protocol (ISO 11898-7) and/a K-line bus protocol (ISO 9141 and ISO 14230-1), and/or an Ethernet™ bus protocol IEEE 802.3 (2002 onwards), etc.

Figure 8:
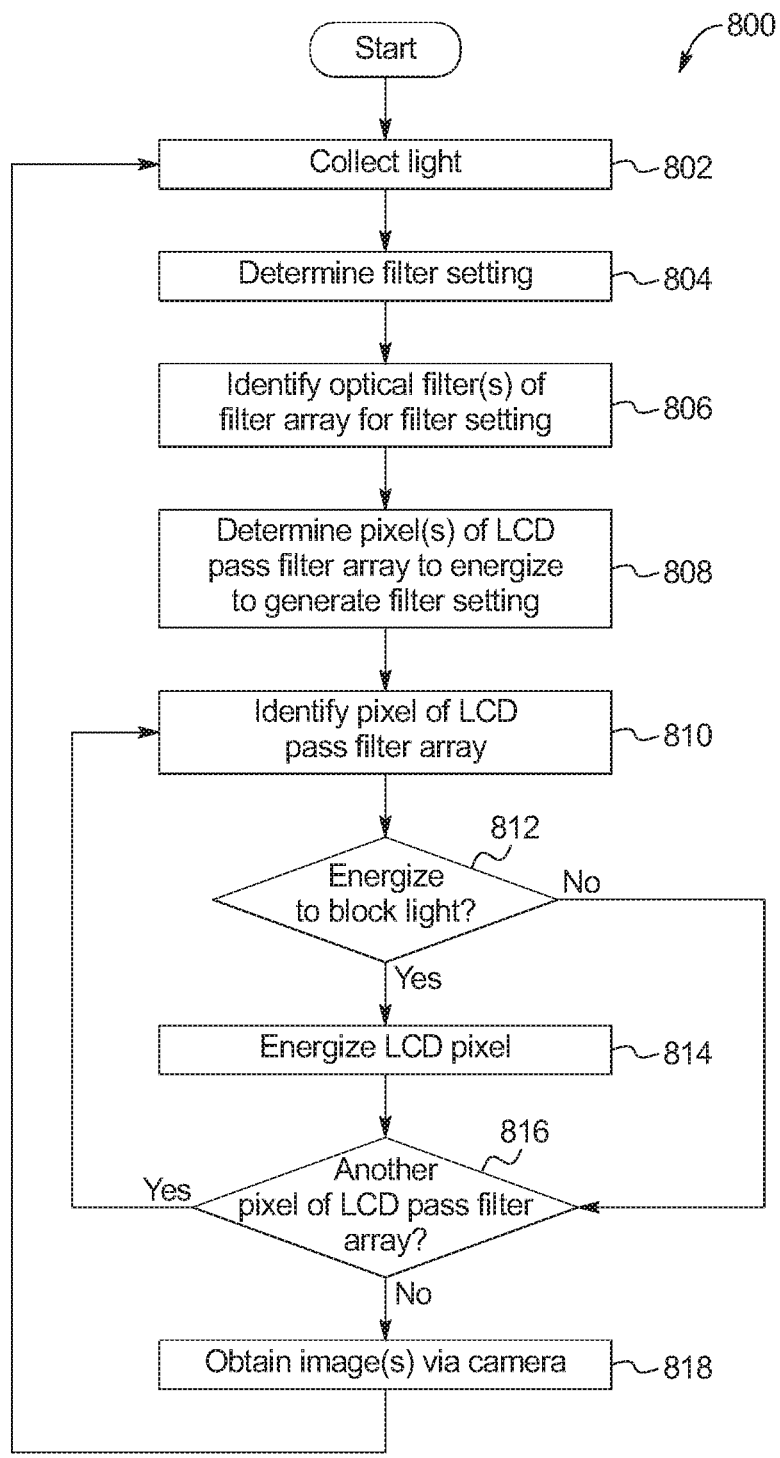
FIG. 8 is a flowchart for adjusting a filter of a camera via adjustable stacked filter arrays in accordance with the teachings herein.

FIG. 8 is a flowchart of an example method 800 to adjust a filter of a camera via adjustable stacked filter arrays. The flowchart of FIG. 8 is representative of machine readable instructions that are stored in memory (such as the memory 714 of FIG. 7) and include one or more programs which, when executed by a processor (such as the processor 712 of FIG. 7), cause the vehicle 100 to implement the example filter controller 116 of FIGS. 1 and 7. While the example program is described with reference to the flowchart illustrated in FIG. 8, many other methods of implementing the example filter controller 116 may alternatively be used. For example, the order of execution of the blocks may be rearranged, changed, eliminated, and/or combined to perform the method 800. Further, because the method 800 is disclosed in connection with the components of FIGS. 1-7, some functions of those components will not be described in detail below.

Initially, at block 802, a camera (e.g., the camera 102, the camera 104) and/or an adjacent ambient light sensor (e.g., the ambient light sensor 110, the ambient light sensor 112) collects light (e.g., ambient light) of an area surrounding the camera. At block 804, the filter controller 116 determines a filter setting based upon the collected light that affects image(s) and/or video captured by the camera (e.g., to increase a clarity of the captured image(s) and/or video).

At block 806, the filter controller 116 identifies a set of the array of the optical filter pixels 402 on the plate 214 (e.g., a first set of the optical filter pixels 402) that are configured to form the filter setting. For example, the filter controller 116 identifies one or more of the NIR pass filter pixels 404, one or more of the NIR cut filter pixels 406, one or more of the polarizing filter pixels 408, one or more of the clear filter pixels 410, and/or any combination thereof for forming the filter setting. At block 808, the filter controller 116 determines which pixels of the array of the LCD pass filter pixels 302 on the plate 212 are to be energized, based upon the optical filter pixels 402 identified at block 806, to form the filter setting selected at block 804. That is, the filter controller 116 identifies a first set of the LCD pass filter pixels 302 to de-energize to expose those of the optical filter pixels 402 (e.g., a first set of the optical filter pixels 402) that form the filter setting and identifies a second set of the LCD pass filter pixels 302 to energize to cover those of the optical filter pixels 402 (e.g., a second set of the optical filter pixels 402) that do not form the filter setting.

At block 810, the filter controller 116 identifies one of the LCD pass filter pixels 302 of the array on the plate 212. At block 812, the filter controller 116 determines whether the filter controller 116 is to energize the selected one of the LCD pass filter pixels 302 to block light from travelling through the selected one of the LCD pass filter pixels 302. For example, the filter controller 116 determines whether to block light from travelling through the selected one of the LCD pass filter pixels 302 based upon whether the one or more of the optical filter pixels 402 that correspond to the selected one of the LCD pass filter pixels 302 at least partially form the selected filter setting. If the corresponding one or more of the optical filter pixels 402 at least partially form the selected filter setting, the filter controller 116 is to energize the selected one of the LCD pass filter pixels 302 to cause the selected one of the LCD pass filter pixels 302 to become opaque. If the corresponding one or more of the optical filter pixels 402 does not at least partially form the selected filter setting, the filter controller 116 is to de-energize the selected one of the LCD pass filter pixels 302 to cause the selected one of the LCD pass filter pixels 302 to become transparent.

In response to the filter controller 116 determining that the selected one of the LCD pass filter pixels 302 is to be opaque to block light, the filter controller 116 sends an electrical signal to energize the selected one of the LCD pass filter pixels 302. Upon the filter controller 116 energizing the selected one of the LCD pass filter pixels 302 at block 814 or in response to the filter controller 116 determining at block 812 that the selected one of the LCD pass filter pixels 302 is not to block light, the method 800 proceeds to block 816.

At block 816, the filter controller 116 determines whether there is another one of the LCD pass filter pixels 302. In response to the filter controller 116 determining that there is another one of the LCD pass filter pixels 302, the method 800 returns to block 810. Otherwise, in response to the filter controller 116 determining that there is another one of the LCD pass filter pixels 302, the method 800 proceeds to block 818 at which the camera captures image(s) and/or video utilizing the filter setting.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively. Additionally, as used herein, the terms "module" and "unit" refer to hardware with circuitry to provide communication, control and/or monitoring capabilities, often in conjunction with sensors. A "module" and an "unit" may also include firmware that executes on the circuitry.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
   a camera including:
   a lens;
   image sensors; and
   LCD (liquid crystal display) pass filter pixels and optical filter pixels stacked between the lens and the image sensors; and
   a filter controller to:
   identify a first set of the optical filter pixels that form a filter setting of the camera;
   identify a first set and a second set of the LCD (liquid crystal display) pass filter pixels based on the first set of the optical filter pixels; and
   form the filter setting of the camera by:
   de-energizing the first set of the LCD (liquid crystal display) pass filter pixels to expose the first set of the optical filter pixels; and
   energizing the second set of the LCD (liquid crystal display) pass filter pixels to cover a second set of the optical filter pixels.

2. The vehicle of claim 1, wherein the filter controller is configured to:
   identify a third set of the optical filter pixels that form a second filter setting; and
   de-energize a third set of the LCD pass filter pixels to expose the third set of the optical filter pixels to form the second filter setting.

3. The vehicle of claim 1, wherein each of the LCD pass filter pixels is transparent when de-energized to expose an adjacent one or more of the optical filter pixels and opaque when energized to cover the adjacent one or more of the optical filter pixels.

4. The vehicle of claim 1, wherein the camera further includes a first plate that includes the LCD pass filter pixels and a second plate spaced apart from the first plate that includes the optical filter pixels.

5. The vehicle of claim 4, wherein the camera further includes a camera body that houses the first plate, the second plate, the image sensors.

6. The vehicle of claim 4, wherein the camera further includes a lens housing that houses the first plate, the second plate, and the lens.

7. The vehicle of claim 1, wherein the LCD pass filter pixels are positioned between the lens and the optical filter pixels.

8. The vehicle of claim 1, wherein the optical filter pixels include a plurality of filter types that are intermixed along a plate.

9. The vehicle of claim 8, wherein the plurality of filter types include a near-infrared pass filter, a near-infrared cut filter, a polarizing filter, and a clear filter.

10. The vehicle of claim 1, wherein the LCD pass filter pixels form a photon sieve pattern in which the LCD pass filter pixels that are closer to a center of the photon sieve pattern are larger than the LCD pass filter pixels that are farther from the center of the photon sieve pattern.

11. The vehicle of claim 1, wherein each of the LCD pass filter pixels align with a respective one of the optical filter pixels.

12. The vehicle of claim 1, further including an ambient light sensor adjacent to the camera, the filter controlling determining the filter setting based upon an ambient light detected by the ambient light sensor.

13. A method, comprising:
    determining a filter setting of a vehicle camera;
    identifying a first set of optical filter pixels positioned between a lens and image sensors of the vehicle camera that form the filter setting;
    identifying a first set and a second set of LCD (liquid crystal display) pass filter pixels based on the first set of the optical filter pixels, the LCD (liquid crystal display) pass filter pixels are stacked with the optical filter pixels between the lens and the image sensors; and
    forming the filter setting of the vehicle camera by:
    de-energizing the first set of LCD (liquid crystal display) pass filter pixels to expose the first set of the optical filter pixels; and
    energizing the second set of the LCD (liquid crystal display) pass filter pixels to cover a second set of the optical filter pixels.

* * * * *